United States Patent [19]

Nederlof et al.

[11] 4,296,475
[45] Oct. 20, 1981

[54] WORD-ORGANIZED, CONTENT-ADDRESSABLE MEMORY

[75] Inventors: Leendert Nederlof, Eindhoven, Netherlands; Roelof H. W. Salters, Sunnyvale, Calif.

[73] Assignee: U.S. Philips Corporation, New York, N.Y.

[21] Appl. No.: 970,883

[22] Filed: Dec. 19, 1978

[51] Int. Cl.³ ............................................. G11C 15/04
[52] U.S. Cl. ..................................... 364/900; 365/49
[58] Field of Search ... 364/200 MS File, 900 MS File; 365/49, 200; 235/306

[56] References Cited

U.S. PATENT DOCUMENTS

| | | | |
|---|---|---|---|
| 3,221,308 | 11/1965 | Petersen et al. | 364/900 |
| 3,588,845 | 6/1971 | Ling | 365/49 |
| 3,611,315 | 10/1971 | Murano et al. | 364/200 |
| 3,648,254 | 5/1972 | Beausoleil | 364/900 |
| 3,840,862 | 10/1974 | Ready | 364/200 |
| 4,051,461 | 9/1977 | Hashimoto et al. | 364/200 |
| 4,056,844 | 11/1977 | Izumi | 364/200 |
| 4,064,489 | 12/1977 | Babb | 364/200 |
| 4,068,303 | 1/1978 | Morita | 364/200 |

Primary Examiner—Gareth D. Shaw
Assistant Examiner—Thomas M. Heckler

Attorney, Agent, or Firm—Thomas A. Briody; Robert T. Mayer; James J. Cannon, Jr.

[57] ABSTRACT

A word-organized, content-addressable memory comprises per word location a validity indicator, having a position "valid" and a position "invalid", and a correspondence indicator. The following functions can be performed:
- (a) associative searching and reading of the content of a word for which correspondence occurs (R);
- (b) reading the next word in sequence of words for which correspondence occurs (SR);
- (c) loading a mask word in the mask register (LM);
- (d) selective invalidating of the content of one or more predetermined word locations (CPM);
- (e) writing in an empty word location, i.e. a location not having a valid data content (WFP);
- (f) writing data in a number of selective bit positions of one or more words for which correspondence occurs (WP).

There is also provided a mask register whose data activate the comparisons as well as the outputting of data for which no comparison has taken place.

As a result of such an organization, a very versatile use is realized for a comparatively inexpensive memory. In a memory of this kind, constructed as an integrated circuit, moreover, only a small number of connections are required per number of bit positions.

9 Claims, 8 Drawing Figures

WORD-ORGANIZED, CONTENT-ADDRESSABLE MEMORY

BACKGROUND OF THE INVENTION

1. Field of the Invention

This invention relates to a word-organized, content-addressable memory, comprising a first input for inputting a key word, a second input for inputting a mask word for the selective deactivation of a part of the input key word by masking, an output for outputting a data word stored in a word location, first means for comparing a non-masked part of a key word with a corresponding part of a data word stored in a word location, and second means for indicating, for each word location, correspondence detected by said first means and for activating said output for outputting data from a word location for which correspondence occurs.

2. Description of the Prior Art

A memory of this kind is known from the article by J. Barlett et al, Associative Memory Chips: fast, versatile and here, Electronics (700,817) pages 96-100; for example, the memory 4102 by Fairchild Semiconductor Corp. described on page 97 which comprises four words of four bits. For these 16 bits, the integrated circuit of said memory comprises twenty-four connection pins, i.e.:

(a) four connections for an address, so that the data can also be addressed in the manner of a random access memory (RAM);
(b) four connections for a descriptor word which indicates the keyword;
(c) four connections for enable data, i.e. concerning the mask word; (the bit locations masked by the mask word are not taken into account for the comparison);
(d) four connections for a correspondence signal, i.e. one for each separate word;
(e) four connections for the parallel output of the data of a four-bit content word;
(f) one connection for the inverted correspondence signal;
(g) one connection for a write enable signal; and
(h) two current connections; thus in total 24 connections.

The number of connection pins for each data bit stored is calculated as $(5n+4)$ divided by $n^2$ for a square matrix of $n \times n$ bits, which is comparatively high. On a matrix comprising 40 connection pins, at the most $7 \times 7$ bits could be accommodated.

SUMMARY OF THE INVENTION

The invention has for its object to reduce the number of connection pins required for a content-addressable memory of the described kind, while maintaining a high degree of flexibility in the use and easy control in comparison with the known memory. The objects of the invention are realized in that the second means comprise a validity indicator for each word location, having a position "valid" and a position "invalid", for selectively indicating the validity of the word stored at this location, and for each word location a correspondence indicator, having a position "correspondence" and a position "non-correspondence", said validity indicator acting as a bit position of the associated word location, so that when the memory is addressed with respect to valid word location content, the position "invalid" blocks the associated correspondence indicator for the effective supply of a signal "correspondence", each validity indicator comprising a switch input for selectively setting the indicator, by an externally applied switch signal, to the one or to the other position. Thus, first of all a number of address pins can be eliminated. Elimination can be understood as follows: the validity indicator indicates whether a word location contains valid data. When the validity indicator is set to "invalid", a memory word can be quasi erased without the physical address of the relevant memory word having to be externally known; therefore, it need not be stored elsewhere either. The invention in this respect is based on the idea that the physical address of a word per se is of no importance to a user. As a result of the associative searching of a validity indicator which is in the position "invalid", an available "free" word location is found. Again external physical addressing is not required.

Preferably, third means are provided for clearing a part of the memory and for switching, under the control of a correspondence signal from the correspondence indicator of one or more word locations, the validity indicator of said one or more word locations to the position "invalid". Thus, the clearing is controlled by the data of a word rather than by the physical address thereof. This results in simpler control, because said physical address need not be externally known for this purpose.

Preferably, there is provided a multiple match resolver for forming, in the case of the simultaneous appearance of at least two active "corresponding" signals, a sequence for the treatment of the associated word locations, while for the writing of a data word in a word location, the bit position corresponding to the data of the validity indicator remains exclusively unmasked by the mask word in order to control, in the position "invalid", the associated correspondence indicator so as to form a position "correspondence", after which the multiple match resolver controls a write enable signal for a single word location thus provided with a correspondence signal. Thus, if a plurality of word locations contain only invalid data, a single word location thereof can be readily filled with new data. The physical address again need not be externally known.

Preferably, fourth means are provided for switching, under the control of a sequence signal from said multiple match resolver, the correspondence indicator for a word location indicated by said sequence signal to the position "non-correspondence" in order to apply, when a read command signal is received, the data of a word location to said output only once. This results in the attractive additional function of the sequential reading of a number of corresponding words only once, which is performed by the already provided correspondence indicators.

Preferably, there are provided fifth means for writing, under the control of an operational correspondence signal from a correspondence indicator, predetermined data for the bit positions of the relevant word location which are not masked by the prevailing mask word, and fifth means furthermore being adapted to simultaneously write predetermined data, under the control of simultaneously appearing effective correspondence signal from the correspondence indicators of at least two word locations, for the bit positions of the relevant word locations which are not masked by the mask word then prevailing. The data of a single word or of a number of words (each time containing the same data, however) can thus be readily updated.

Preferably, there is provided a mask register for a mask word whose non-masked data location (locations) bit-wise activate(s) said first means and whose masking data locations bit-wise activate said output. The mask often remains unmodified for a number of successive memory operations. As a result of the double use of the output signals of the register, the control of the memory is simplified.

The memory, constructed as an integrated circuit, preferably comprises a mask register for a mask word whose outputs are connected to said first means, said first input, said second input, said output, and an input for the input of a data word to be stored in a word location being connected together, via pins which are common per bit position, to a data bus line. As a result, a small number of connection pins suffices, as will be described in detail hereinafter. This is particularly advantageous for the manufacture of integrated circuits. It will also be obvious that the number of connection pins can be further reduced in known manner by utilising serial data transport. This technique can be applied separately as well as in combination with the decribed steps.

Furthermore, there is preferably provided a separate integrated circuit for the storage of n data words of m bits plus an associated mask word of corresponding length, said separate circuit comprising, in addition to m connections to said bus, n connections which are each associated with a separate word and which serve for a correspondence signal for each word, and also power supply terminals as external connections, at least three connections for receiving mode selection signals in order to activate a decoder in the circuit, and also a connection for receiving a clock signal. Thus, a large number of functions can be performed within the integrated circuit, while only a limited number of external connections (pins) is required in comparison with the number of n×m data bits stored in the circuit.

Furthermore, said n connections are preferably suitable for transporting a correspondence signal from said circuit as well as a pointer signal to said circuit, said n connections each comprising a unidirectional element, provided with a control terminal for alternatively determining a conducting direction therein, the control terminals of the n unidirectional elements all being interconnected in order to form together a single further external connection of said circuit. As a result of such a single additional connection, double use can be made of a single connection for each word location and the integrated circuit has many facilities while the number of external connections is limited.

The invention will be described in detail hereinafter with reference to the accompanying diagrammatic drawings.

DESCRIPTION OF THE PREFERRED EMBODIMENT

Figure 1:
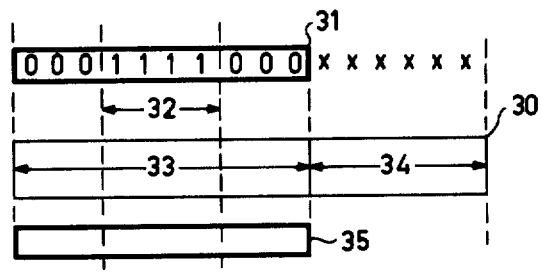
FIG. 1 shows a circuit diagram of a word-organized, content-addressable memory.

FIG. 1 gives an elementary idea of the operation of a content-addressable memory. In this example, each of the actual memory words in the memory 30 contains 16 bits. These words contain a keyfield 33, in this case consisting of ten bits, and a data field 34 which in this case contains six bits. For comparison with the actual content of the memory words, a keyword 35 of ten bits is applied, the position thereof corresponding to that of the key field. Finally, there is present a mask word 31 comprising ten bits whose position corresponds to that of the key field. The bits of the mask word have a first value (in this case 1 for the bits in the word section 32) or a second value (in this case 0). Only the bits of the key word whose positions correspond to mask bits of the first value are taken into account for the actual comparison. Outside this actual key field, data of indefinite value in practice are applied for comparison. If the data content of the bits of the key word 35 which are not masked by the mask word 31 corresponds to that of the corresponding bit positions of a word stored in the content-addressable memory, a correspondence or match signal is reserved for the relevant word. This correspondence signal is applied to a user device not shown. If desired, this device can have at its disposal the data of the data field of the relevant memory word. The foregoing description was given merely by way of example. The word length may be different. The data content of the mask word is arbitrary. Furthermore, the distinction between key field and data field may be absent, so that in the case of correspondence all bits that were masked during the content-addressing of the memory become available as data bits for a user. Notably in that case, an indefinite value may be applied for comparison for all masked bit positions. This can be realized by way of an output stage which is capable of supplying a logic "1", a logic "0" as well as a high output impedance (so-called tri-state buffer).

Furthermore for cases of correspondence for a plurality of word locations, the associated data bits being required elsewhere, a device may be provided for forming a sequence for the word locations to be addressed. Such a sequence determining device as known from an article by G. A. Anderson, "Multiple match resolvers", I.E.E.E. Trans. Computers C-23 (7412), 1317. If only a single word location is to be addressed in the case of multiple correspondence, a device of this kind thus acts as a priority determining device. If a plurality of word locations are to be addressed, a device of this kind acts as a sequence generator (sequencer). For logic and electronic details, reference is made to the following figures.

Figure 2:
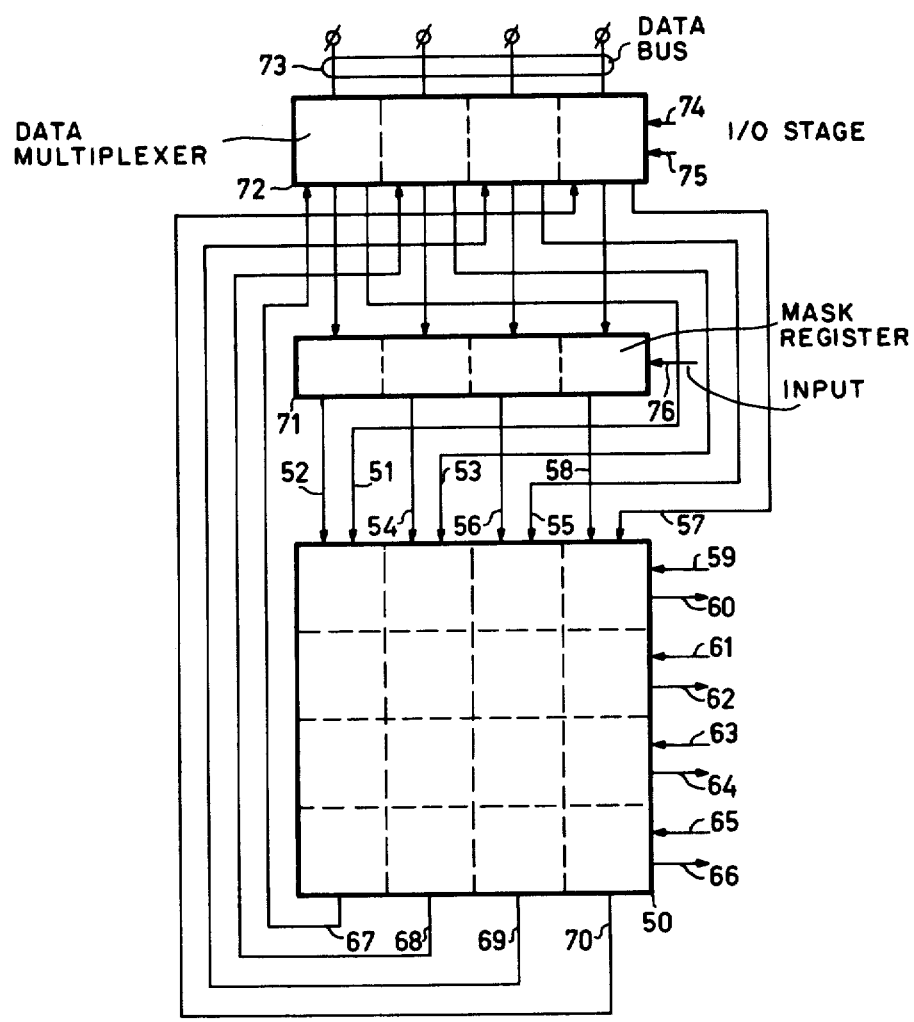
FIG. 2 shows a diagram and the necessary connections of the memory of FIG. 1.

FIG. 2 shows a number of connections required for a matrix 50, comprising 4×4 bits, to be used in a content-addressable memory. For each position column (denoted by dotted line) there is provided a data input (51, 53, 55, 57), a mask bit input (52, 54, 56, 58) and a data output (67, 68, 69, 70). For each word row (denoted by dotted line) there are provided a signalling line (60, 62, 64, 66) and a word selection line (59, 61, 63, 65). The signalling lines serve for outputting a correspondence signal for each word row. The selection lines serve for selecting a predetermined word row. Furthermore, there is provided a four-bit bi-directional connection 73 to the environment. The element 71 is a four-bit mask register which is capable of storing mask data under the control of an external load signal on the input 76. The element 72 is an input/output stage which is controlled by the relevant signals on the lines 74, 75. The actual memory matrix comprises 5n connections for this n×n organization (the connections for power supply are not shown). The embodiment of a content addressable memory yet to be described may have the following operating modes:

(a) associative searching and reading of the content of a word for which correspondence occurs (R);

(b) reading the next word of a sequence of words for which correspondence occurs (SR=sequential read);

(c) loading the characteristic mask word in the mask register (LM=load mask);

(d) selective invalidating of the content of one or more predetermined word locations (CPM=clear part of memory);

(e) writing in a free word position, i.e. one not containing valid data (WFP=write free position);

(f) writing data in a selective number of bit positions of a word or number of words simultaneously if correspondence occurs for this word or these words (WP=write parallel).

These six operating modes may be defined within the space of a three-bit operation code (opcode), two free codes remaining within three bits, if necessary. One of these two codes could be defined as "restore the position of the selection indicating data", which indicates the next word to be read under mode b) so that, for example, a predetermined number of words of a selection is indicated (CP=clear pointer).

The number of connections of the integrated circuit can be reduced by centralizing the control and by combining the data connections. First of all, the circuit shown in FIG. 2 comprises a four-bit mask register 71 for this purpose. In the case of a series of content addressing operations, the key word will change in many cases, while the mask word remains the same. The data stored may concern, for example, an identification and a number of variables for each identification (for example, a product number and quantity of stock). In that case, a search is made each time on the basis of an identification which usually contains the same bit positions which comprise, for example, the field with the product number, when the stock is successively updated for a number of products. The circuit shown in FIG. 2 furthermore comprises a data multiplexer 72. For each bit position, this multiplexer has a first input connected to a corresponding input of the mask register 71, and a second output connected to a corresponding data input of the matrix. Finally, for each bit position the multiplexer 72 has an input connected to a data output of the matrix, each bit position also being connected to a bit line of the bidirectional data BUS line 73. The multiplexer has three operating modes and receives a two-bit control signal on the lines 74, 75 for this purpose. The mask register 71 has two operating modes (loading, not loading) and receives a one-bit signal on line 76 for this purpose. The control will be described in detail hereinafter.

Figure 3:
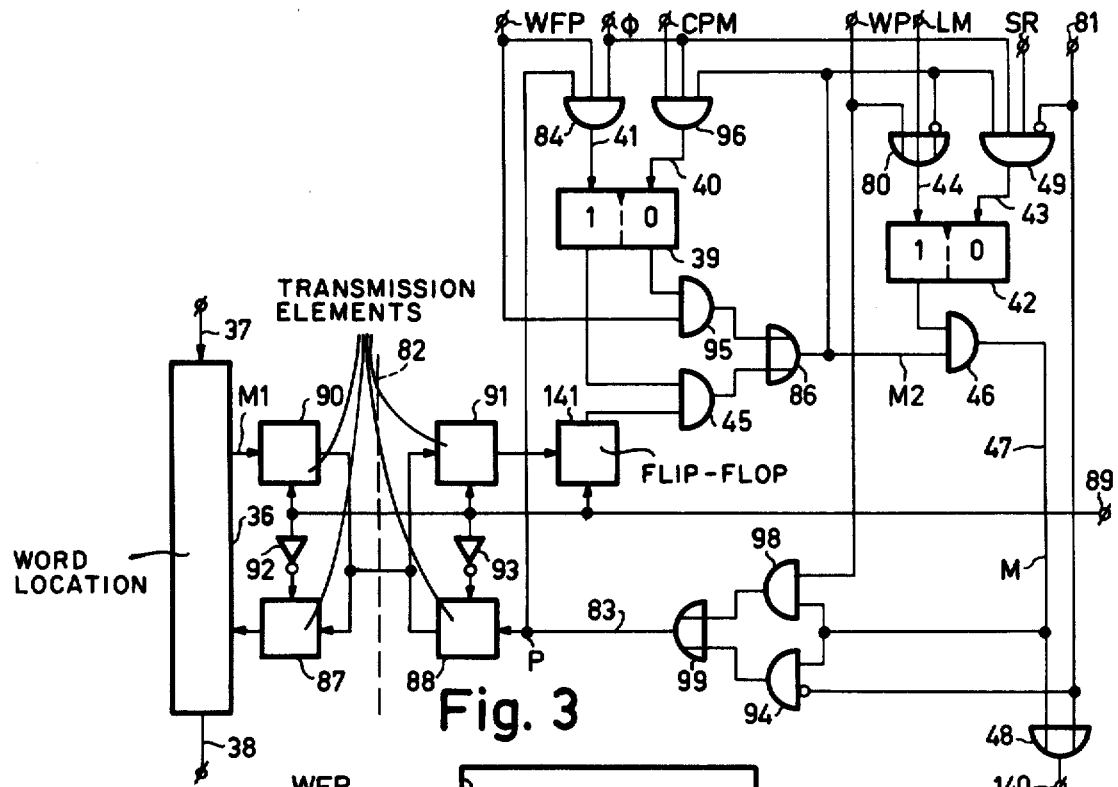
FIG. 3 shows the set-up of a memory word location.

FIG. 3 shows the logic set-up of a word location in a content-addressable memory, and also the control provided for one word location. The dotted line 82 represents the separation, to be discussed hereinafter, between storage circuits and control circuits which are to be arranged in modular form. The word location first of all comprises the actual bit positions 36 which for each bit contain a circuit, to be elaborated hereinafter, for selectively executing the operations reading, writing and comparison for each bit. The number of bit positions 36 does not form a restriction for the invention. The input 37 for key/mask and data and the output 38 for data are diagrammatically shown. When addressing according to content, in the case of correspondence a signal M1 appears as a logic "1" on an output which is connected to the word location. Furthermore, for each word location there are two additional bit positions (39, 42) which are constructed as flip flops. Furthermore, a part of a multiple match resolver is assigned to the relevant word locations as will be explained hereinafter. In the flip-flop 39, a "validity" or "fill" bit is stored. This bit has the value 1 if valid data are stored in the relevant word location. In the opposite case, a logic "0" is stored in this word location, which thus blocks the AND-gate 45, so that the output signal thereof remains logic "0", independent of the value of the signal M1 transported via the interface line 82. The flip-flop 39 comprises a set input 41 and a reset input 40. The set signal on 41 appears under the control of the signal of the previously described operating mode WFP (write in a free word position), which may be common to a number of word positions, in cooperation with a pointer signal P on the line 83 which may have the value "1" for at the most one word position. The AND-gate 84 supplies, co-controlled by a clock pulse on the input Φ, a logic "1" only if WFP=P=1, the flip-flop 39 thus being set to the "1" position. The rest position of the flip-flop 39 is formed by the "0" position in which the word location does not contain valid data. The pointer signal P on the line 83 is formed by the OR-gate 99 which in that case receives a signal from AND-gate 94 (the signal WP is low, so that the AND-gate 98 supplies a logic "0"). The AND-gate 94 forms part of the sequence generator as will be described hereinafter. Simultaneously with the described operations, the data received on the line 37 are stored in the word position 36. To this end, the input 89 receives a low signal whereby transmission elements 87 and 88 are controlled to conduct by way of the inverters 92 and 93. Moreover, this low signal drives the data flip-flop 141 to the hold position.

Figure 3A:
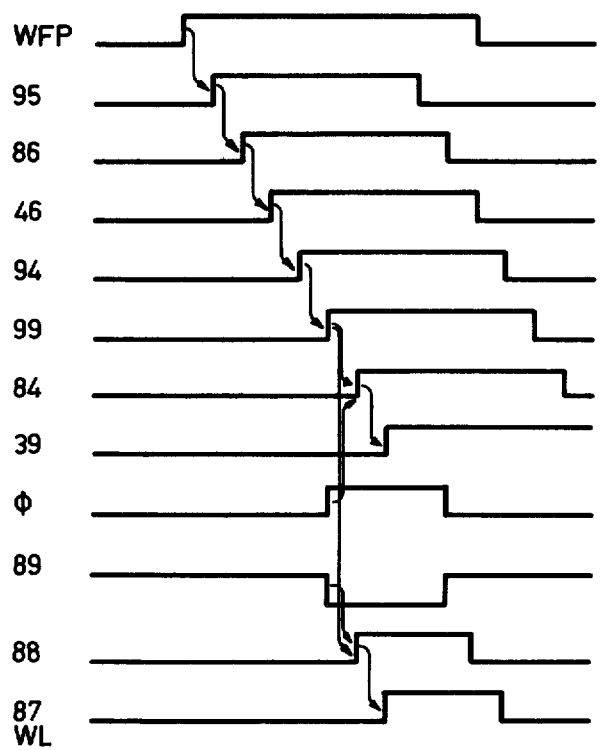
FIG. 3a is a time diagram of the operation of the circuit of FIG. 3.

During a previous operation, a search action has been performed for which only the inverted value of the validity bit has been taken into account in that said signal WFP is combined with the signal on the zero output of the flip-flop 39 in the AND-gate 95. The entire data field is then masked, so that none of the word positions supplies a signal M1 having the value "1". In other cases, the inverted value of the signal WFP can also block the AND-gate 45. Controlled by the signal WFP, the output signal across the AND-gate 95 reaches, as the signal M2, the OR-gate 80 and the AND-gates 46, 49 and 96, via the OR-gate 86. The AND-gates 49 and 96 are blocked in that the signals SR and CPM have the value "0". The flip-flop 42 is then in the "1" position. Thus, the AND-gate 46 also supplies a logic "1". All word positions without valid data thus supply the signal M=1. Input 81 is connected to an output of the directly preceding word. Output 140 of the OR-gate 48 forms this output for the word considered, so it is connected to the relevant "81" input of the directly subsequent word. The sequence of the words is determined, for example, by the geometry of the circuit. The first word of the sequence receives a logic "0" on its "81" input. For the one word position for which the input 81 receives a logic "0" and for which, moreover, the signal M = 1, the AND-gate 94 supplies a logic "1". The latter "1" acts as a pointer signal which remains valid for a sufficient period of time, i.e. as long as is required for the signal on the input 89 to change from the value "0" to the value "1". The output of the gate 94, or on the othere side of the OR-gate 99, may comprise a monostable multivibrator (not shown) having an astable period of, for example, one clock pulse period, when the signal on the line 89 changes to the other value after one clock pulse period (or slightly sooner). FIG. 3A shows a time diagram of these occurrences, the waveforms shown being those appearing on the outputs of the switching elements. The arrows indicate the causal connections.

On the other side, the reset signal appears on the line 40 of the flip-flop 39 under the control of the operating mode CPM (in the case of correspondence with a predetermined non-masked, key word, sets part of the memory to "free"), in cooperation with the output signal M2 of the OR-gate 86 and a clock pulse on input φ. The signal of the gate 86 originates from the gate 45, because the signals WFP and CPM do not both have the value "1". By combination of the three signals, the AND-gate 96 then supplies a reset signal for the flipflop 39. Contrary to the above-described situation in the operating mode WFP, the data of all word locations for which correspondence exists can now be "invalidated" together. This is effected for all word locations which supply a signal M1 = 1 upon comparison with a non-masked key field. When the signal on the line 89 has a high value, the transmission elements 90 and 91 conduct, and the transmission element 87 and 88 are blocked. The data flipflop 141 then also acts as a transmission element. The elements 91 and 141 may be joined into a single data flipflop. When suitable steps are taken, for example, by introduction of suitable threshold values for the control inputs of the transmission elements, it is ensured that the signals to be conducted by the elements 87, 91 originate exclusively from the elements 88 and 90, respectively. For the remainder, the position of the flipflop 39 remains the same. Even though this is now shown as such in FIG. 3A, the signal on the terminal 89 may be tri-valent (0, 1), terminated by a high impedance), none of the elements 87, 88, 90, 91 conducting in the case of the third value.

A correspondence or match bit is to be stored in the bit location 42. This bit has the value 1 if a correspondence signal is permissible in the relevant word location; it is only in that case that the AND-gate 46 is conductive for the output signal M2 conducted by the element 86. The signal M is thus formed on the output 47, with the result that the memory functions to be effected in the case of correspondence are released. The flipflop 42 is normally in the "1" position, which indicates that, when correspondence is detected (signal M2), the content of the relevant word location may be used. If this flipflop 42 is in the "0" position, the relevant word location is out of use, notably because the relevant word location has already been read out during the reading of a series of words. The flipflop 42 comprises a set input 44 and a reset input 43. The reset signal on the line 43 appears, co-controlled by a synchronizing clock signal on the terminal Φ, if all three following conditions are satisfied:

(1) a signal prevails which controls the reading of a next word of a sequence of (at least one) words for which correspondence occurs (SR);
(2) no correspondence signal M of a word of higher rank is present, so that the input 81 receives a logic "0";
(3) the signal M2 has the value "1" for the relevant word. These four signals are combined by the AND-gate 49 which can be blocked, via an inverted input, by a signal from the directly preceding word on the input 81.

Figure 3B:
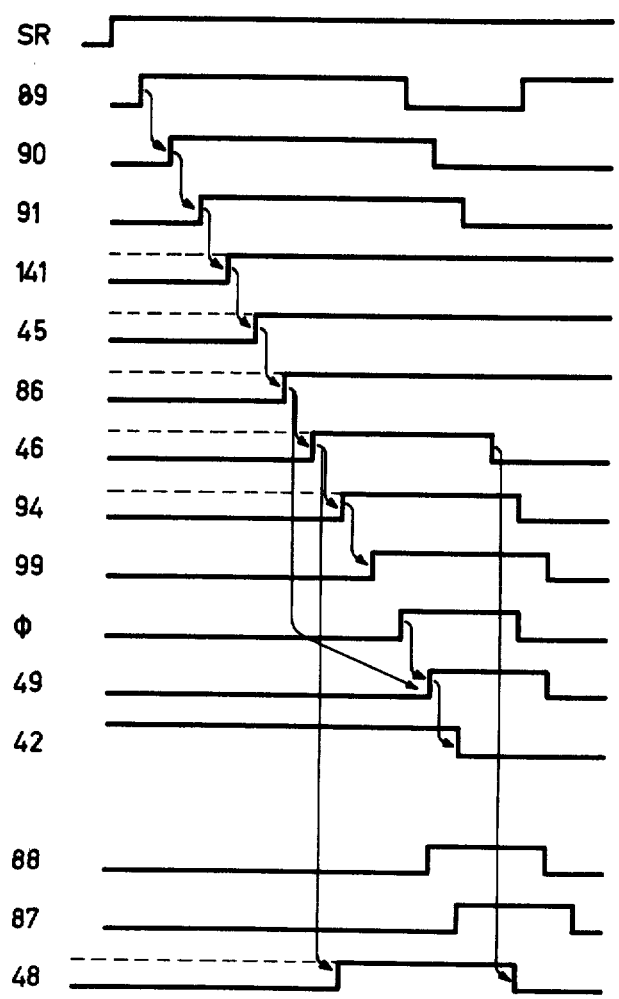
FIG. 3b shows the forward and return data transfer for the operation of the circuit of FIG. 3 in one operating mode.

During the sequential reading of a number of word locations, the flip-flop 42 of a next corresponding word is set to the "0" position, so that the above condition 2) is satisfied also for a further word of the correspondence sequence. If (see above) instead of the command SR, however, the command R is given, the above three conditions are not satisfied and the position of the flip-flop 42 remains the same. According to this possibility, the same word may then be read an arbitrary number of times. In the case of an instruction SR, a number of word locations can initially supply a signal M = 1. The output signal of the gate 94 (prior to the resetting of the flipflop 42) can then activate, after conduction by the elements 88, 87, controlled by the low value of the signal on the terminal 89 as described for the operating mode WFP, the word position 36 in order to read the data on the line 38. FIG. 3b shows the forward and return transport via the interface line for the operating mode SR. The non-interrupted lines denote the reading of the first word of a sequence, the broken lines denoting the reading of the relevant word as if this word were not the first one of a series. Contrary to the foregoing, use can also be made of a known multiple-match resolver sequence generator.

In this case, the set signal on the line 44 appears, possible co-controlled by a clock signal, if at least one of the following conditions is satisfied:

(1) no correspondence signal is present on the output of the gate 86; therefore, there is either no correspondence signal from the flipflop 141 when the flip-flop 39 is in the "1" position, or there is no command WFP when the flipflop 39 is in the zero position. This rest position thus automatically occurs when a new key word is applied for which no correspondence (M1) exists and also when the data of the relevant word location are invalidated;
(2) an additional signal LM is applied which controls the loading of a mask word in the mask register. When a new mask word is applied, all word locations are available again for outputting their data;
(3) an external signal WP is applied which controls the parallel writing in one or more word locations. In that case all word locations must again be available for outputting their data. These cases are effectuated by the OR-gate 80, comprising one inverted input.

The circuit shown is given by way of example. The control signal WFP, COM, WP, LM, SR can be obtained as output signals from a decoder (not shown) which receives a three-bit code. The time diagrams loaded during the execution of the commands SR, R, WP and LM, are not separately shown, because they exhibit only small time-sequential differences as a result of the substantial correspondence in the signal path with the commands WFP and CPM.

Figure 4:
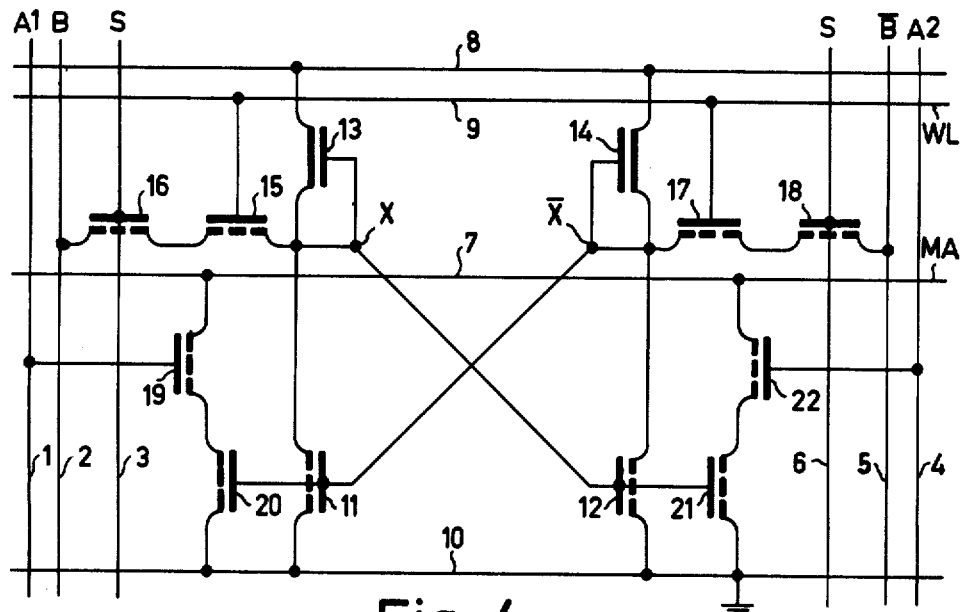
FIG. 4 shows the electronic construction of a memory cell.

FIG. 4 shows an embodiment of a memory for use in a content-addressable memory in accordance with the invention. The memory cell comprises ten external connections 1-10, and twelve n-MOS transistors 11-22. The line 8 is connected to a supply voltage $V_{DD}$ of, for example, approximately 5 V and the line 10 is connected as indicated to ground potential. Contrary to the other transistors, the transistors 13, 14, drawn slightly differently, are depletion transistors: they are also conductive in the case of a zero voltage difference between gate electrode and source electrode. The other transistors, being enhancement transistors, are drawn slightly different again. In the case of a voltage difference zero between gate electrode and source electrode, these transistors are blocked. The lines WL and MA are common to the bit cells of a word, the vertical lines connecting corresponding bit cells of a plurality of words. The transistors 11-14 constitute a hold circuit for 1 bit as a result of their feedback. The cross-wise connection between the transistors 12 and 13 then carries the signal X which indicates the state of the hold circuit. The cross-wise connection between the transistors 11 and 14 carries the inverted value $\overline{X}$ thereof. The line pair 1 carries the signals A1, A2. In the rest condition, these two signals are both logic "0", with the result that the transistors 19, 22 are blocked. This state thus corresponds to the relevant cell being masked for associative searching. In the active state, the signal A1 briefly assumes the value $\overline{A}$, while the signal A2 briefly assumes the inverted value A, as will be explained hereinafter. The line pair 2/5 carries the signals B, $\overline{B}$ which normally have opposed values. The lines 3/6 both carry the same signal S. In the case of associative searching, a signal source (not shown) applies a signal WL having the value 0 on the line 9 (the value 0 being at the most some tenths of a volt), the signals B, $\overline{B}$, S on the lines 2, 3, 5, 6 having an arbitrary value. A logic value "1" then corresponds to a voltage level which is at the most a few tenths of a volt lower than the value 5 volts. The signal WL=0 is generated by a circuit which acts as a clock pulse generator which does not necessarily have a constant frequency. In the above case, generally all word locations are thus activated. Furthermore, during associative searching, the key bit A is applied on the line 1 and simultaneously therewith the corresponding inverted value $\overline{A}$ on the line 4. If A1=0, the transistor 19 remains blocked; if A2=0, the transistor 22 remains blocked. If A1=1, the transistor 19 can conduct. If $\overline{X}$=0, the series connection 9 of the transistors 19 and 20 is blocked. In the latter case, A2=0 and X=1 for associative searching, so that the series connection of the transistors 21 and 22 also remains blocked. The line MA is charged to a high voltage by a transistor not shown, and this logic state is maintained subject to the condition that for the relevant bit cell A1=A=X and A2=$\overline{A}$=$\overline{X}$. On the other hand, if A1≠X and hence A2≠$\overline{X}$ during associative searching, one of the two series connections of the transistors 19/20 and 21/22 is conductive, so that the line 7 carrying the signal MA is discharged. In the case of correspondence of the two data, the line MA thus maintains its high voltage. The line MA is common to all bits of a word. It is only when correspondence occurs for all bits of this word which are taken into account in the comparison with the relevant key bits that the line MA of this word remains at a high potential, so that the signal M1 of FIG. 3 has the value "1". If at least one bit compared does not correspond, the line 7 is discharged and the signal M1 assumes the logic value "0". In the foregoing, the transistors 20 and 21 are controlled by the output signals of the hold circuit, so that the data content of the hold circuit remains the same. The line 7 can also comprise one signal amplifier (not shown) for the entire word in order to increase the response time; amplifiers of this kind are known.

In the case of a write operation, the following pattern is generated by signal sources not shown. The lines 1 and 4 continue to carry a low signal (A1=A2=0), so that the transistors 19 and 22 are continuously blocked. The lines 9 (signal WL), 3 and 6 (both signal S) all carry a high signal. Via lines 2 (signal B) and 5 (the inverted signal $\overline{B}$), the desired data are applied. The series connections of the transistors 19/20 and 21/22 are thus blocked in this case, while those of the transistors 15/16 and 17/18 are conductive. The data of X and $\overline{X}$ then correspond to those of B and $\overline{B}$, respectively. The write phase is terminated in that the signal WL becomes low, with the result that the inputs of the hold circuit are isolated from the signals B, $\overline{B}$. Isolation can also be realised in that the signal S becomes low on the lines 3, 6. The signals S and WL may alternatively both become low, certain timing tolerances in this transition being permissible.

In the case of a read operation (R, SR), the content must be signalled to the outside for each bit cell. The lines 1 (signal A1) and 4 (signal A2) then carry a low signal. Subsequently, the lines 2 (signal B) and 5 (signal $\overline{B}$) are both charged to a high voltage by relevant transistors (not shown) in the same manner as described for the line 9 (signal WL). Subsequently, the lines 9 (signal WL) and 3/6 (signal S) are activated by a high voltage. As a result, the series connections of the transistors 15/16 and 17/18 become conductive. Depending on the data content of the hold circuit, one of the two transistors 11, 12 will then be conductive. For the relevant transistor a conductive series connection is thus formed of three transistors, so that only one of the two lines 2, 5 is discharged. In this case reading is non-destructive as a result of the symmetrical control. Moreover, when the charging transistors for the lines 2 and 5 are properly proportioned, only a limited control charge is available and the hold circuit is stable for such a small disturbance.

The lines 3/6 (signal S) have the following function. A write operation can take place in two situations (a) data are to be written in a single available word location, the full word length being utilized by complete deactivation of the mask word. The signal S then obtains the value 1 for all bit positions of the word;

(b) data are to be written in the same field of each of a number (≧1) of simultaneously addressed word locations, i.e. writing each time in a key field. The signal S then assumes the value 1 only for the bit positions of said field.

In the case of a read operation in a single word location, or successively in a series of word locations, the value of the signal S is made 1 only for the bit positions outside the key field. The selective control of the lines 3, 6 by way of the signal S will be described with reference to FIG. 5.

In order to execute the operation "write parallel" (WP), the logic values A and B are on the one hand made equal inside the integrated circuit, while on the other hand those of $\overline{A}$ and $\overline{B}$ are also made equal. The implementation will be described with reference to FIG. 5.

Figure 5:
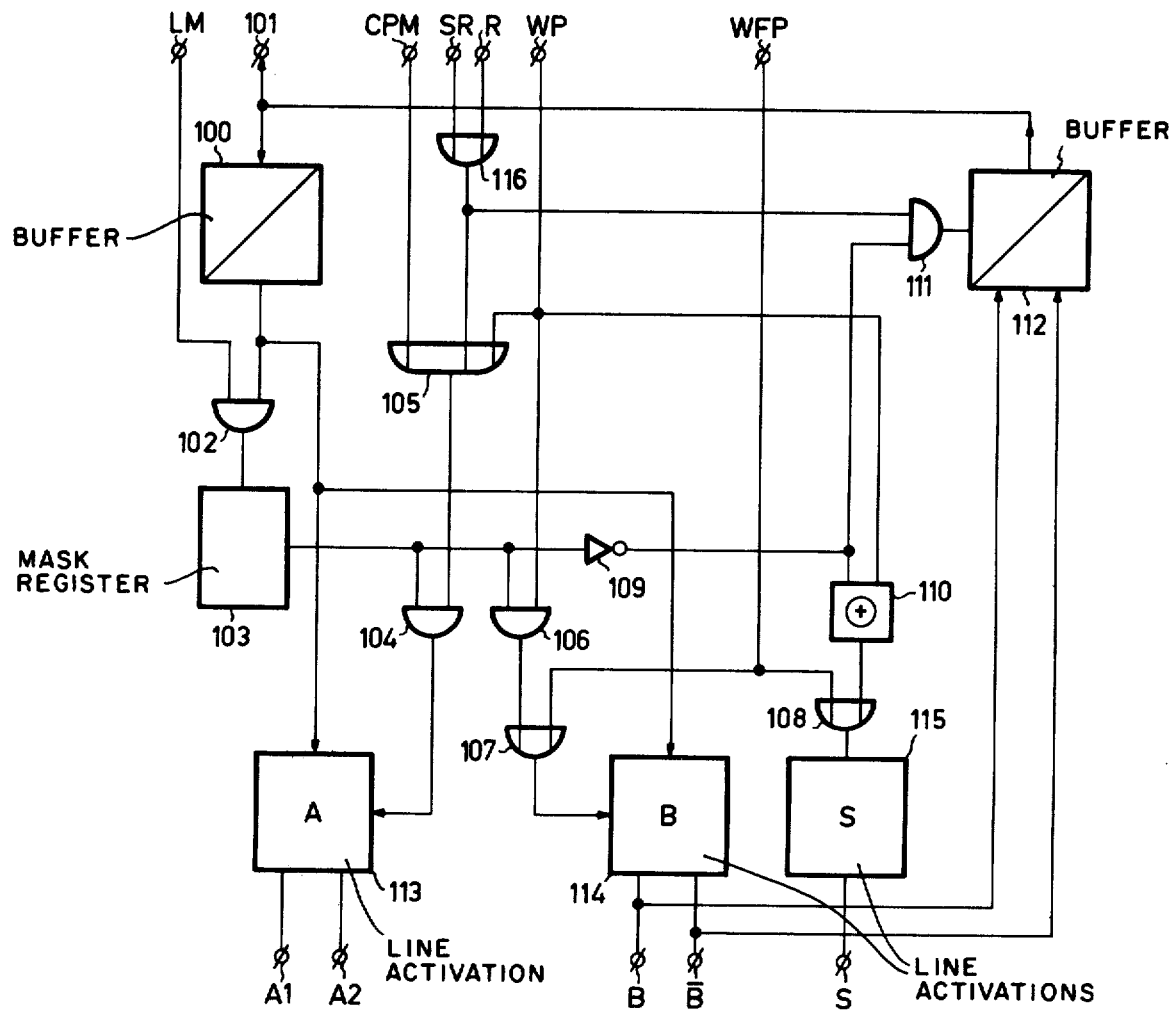
FIG. 5 shows a control element.

FIG. 5 shows a circuit for generating a number of control signals as described in the foregoing. The circuit is suitable for controlling one bit position for each memory word. For a word length of n bits in a storage circuit of the relevant memory, the circuit shown in FIG. 5 should be included n times in this storage circuit. The figure shows a bidirectional data connection 101, six control connections LM, R, SR, CPM, WR, WRP, whose meaning has already been described, and five data outputs A1, A2, $\overline{B}$, B, S for controlling circuits as shown in FIG. 4. The circuit furthermore comprises a mask register 103 for one mask bit, three line activation elements 113, 114, 115, four AND-gates 102, 104, 106, 111, four OR-gates 105, 107, 108, 116, an inverter 109, and an EXCLUSIVE-OR-gate 110. The circuit 100 is a one-bit input buffer, while the circuit 112 is a one-bit output buffer. The latter supplies a tri-valent signal, having the feasible values "logic low", "logic high" and "terminated by a high impedance". The line 101 can thus be used for the input as well as the output of data. If necessary, the elements 100, 112 comprise a level shifting circuit for modifying the logic levels on the line 101 (for example, TTL levels) according to those of the further parts of the circuit (for example, MOS-levels).

During the loading of the mask register 103, the signal LM=1 in order to make the gate 102 conductive. The mask bit is received on the terminal 101 and is stored, via the buffer stage 100 and the gate 102, in the register 103 (in thid case for 1 bit). The mask register 103 has the following functions:

(1) First of all, the content of the mask field, i.e. logic "0" or "1", defines the size of the key field. When the mask register contains a "1", the relevant position forms part of the key field (the gates 104 and 106 are conductive and the gate 111 is blocked via the inverter 109). If the mask register contains a "0", the relevant bit position does not form part of the key field (gates 104, 106 blocked and gate 111 conductive). When the gate 109 supplies a "1", the data on the line 101 are transmitted by the stage 113 on the line A1 and are inverted on the line A2. To this end, the stage 113 comprises a line amplifier which can be driven by the output of the gate 104 and whose output signals have mutually opposed logic values. This amplifier will not be elaborated herein for the sake of brevity. It is thus determined which bits of the key word participate in the comparison. The foregoing is initiated, via the OR-gates 105, 116, by the signals CPM, SR, R, WP, the meaning of which has already been described. If, on the other hand, the AND-gate 104 supplies a logic "0", a logic "0" signal appears on both outputs A1, A2.

(2) The data of the mask register also define the extent of the data to be newly written in the case of a write operation. The data applied to the input 101 are applied, via the buffer stage 100, to the element 114. The latter element has substantially the same construction as the element 113. If the OR-gate 107 produces a logic "1", the element 114 supplies signals of mutually opposed value. On the other hand, if the logic OR-gate 107 produces a logic "0", the lines B, $\overline{B}$ are charged to a high logic value by a transistor circuit (not shown). This transistor circuit may form part of the element 114 and performs the function described with reference to FIG. 4. The logic "1" of the gate 107 appears on the one hand under the control of the signal WFP, only one word location which contains exclusively invalid data being addressed, as has already been described with reference to FIG. 3. In the case of the command WP, this takes place exclusively for the bit positions for which the mask register 103 contains a logic "1", again under the control of a word pointer signal as stated with reference to FIG. 3.

(3) The commands SR and R furthermore activate the conducting of the AND-gate 11 via the OR-gate 116. The AND-gate 111 then supplies a logic "1" under the control of the bit positions for which masking of the key field occurs. This is because the mask register 103 supplies a logic "0" for these bit positions, said logic "0" being inverted by the element 109. In that case, the buffer stage 112 receives the signals B, $\overline{B}$ and supplies a single signal on the output 101, activated by the "1" output signal of the gate 111. Elements of this kind are known per se. When LM (mask loading) or WP (parallel writing) are performed, the signals R and SR are always equal to 0, so that the output buffer 112 is not activated.

The signal LM controls the loading of the mask over the full word width: a data signal is applied on the line 101 for all bit positions. The signal WFP controls the writing over the full word width: elements 114 and 115 are activated for all bit positions. The latter element then supplies a high signal S. The signal WP controls the writing over a part of the word width by way of the content of the bit position 103. If the bit position 103 contains a logic "1", the inverter 109 supplies a "0" and the EXCLUSIVE-OR gate 110 receives two unequal signals, so that the output signal thereof activates the element 115 (via OR-gate 108) as a logic "1". Thus, writing takes place in the non-masked parts of the word locations (i.e. in the key field). On the other hand, if there is no write command (WP=WFP=0), the element 115 is activated, via the inverter 109, only for the positions which are masked, i.e. situated outside the prevailing key field. The gate 111 also conducts for these positions in order to activate the output buffer 112 under the control of the signal SR or R.

The construction of a larger content-addressable memory will be illustrated with reference to FIG. 6. A small memory, constructed as an integrated circuit, contains all bit cells, the mask register and the controls described with reference to FIGS. 3 and 5 accommodated on one and the same substrate. The circuit thus comprises a clock input, three inputs for a three-bit operation code, decoded in the "chip", the sequence input 89 (which may possibly be derived from the clock on the chip), power supply terminals and also one connection (101) for each bit position. The isolating circuit, comprising the elements 87, 88, 90, 91, may possibly be substantially simplified or even omitted, because all components are present on a chip. A 40-pin circuit may then accommodate, for example, 32-bit words. The number of these words per se can be chosen at random. For reasons of modular extension, however, units are required which can be linked in word length as well as in number of words. The arrangement shown in FIG. 6 comprises two types of integrated circuit. First of all, the figure shows the memory chips which are capable of containing 16 word locations of 16 bits. The complete memory contains 64 words of 64 bits, so that each word location is distributed over 4 individual integrated circuits, for example, over the circuits 120, 121, 122, 123. Each of these circuits comprises 256 bit positions of content-addressable memory, sixteen times a circuit as shown in FIG. 5, including one bit mask register and also the elements 90, 87, for each word location, on the side of the control circuits 136, 137 and elements 91, 88 on the side which is remote from these control circuits. The circuit 122 is then connected to the secondary side of the circuit 123 in the same manner as the primary side of the circuit 123 is connected to the output side of the circuit 136. In principle, the word length is then unlimited as far as adequate discrimination exists between the different states: "all bits correspond as regards content upon comparison" and "one single bit position of the two words compared differs". This can be realized by including each time regeneration amplifiers in the lines MA (FIG. 4). Corresponding bit positions of the word locations of the circuits 120, 124, 128, 132 are each time interconnected by way of the bit-wise lines 101 of FIG. 5. Each circuit of 16×16 bits then comprises sixteen data lines (101), sixteen lines which pass through the interface 82 in FIG. 3 (WL/MA in FIG. 4), three lines for the operation code, two power supply lines, a clock line, the line 89; for a 40-pin envelope, one pin then remains for a purpose to be specified.

Control is in this case centralized in two separate integrated circuits 136, 137, each of which operates on 32 words of 64 bits. Each of these circuits thus contains 32 times the circuit shown in the right half of FIG. 3. Besides the 32 word lines, these circuits comprise three pins for receiving an operation code, a clock input, two power supply inputs, and the transmission input 81 and the transmission output 140. A 40-pin envelope again suffices. The signal on the terminal 89 is then derived from the clock pulse (for example, in that a clock pulse received starts one cycle of an auxiliary clock pulse generator which is provided on the chip and which generates a multiple clock pulse). Clock pulse generators of this kind are known per se.

Figure 6:
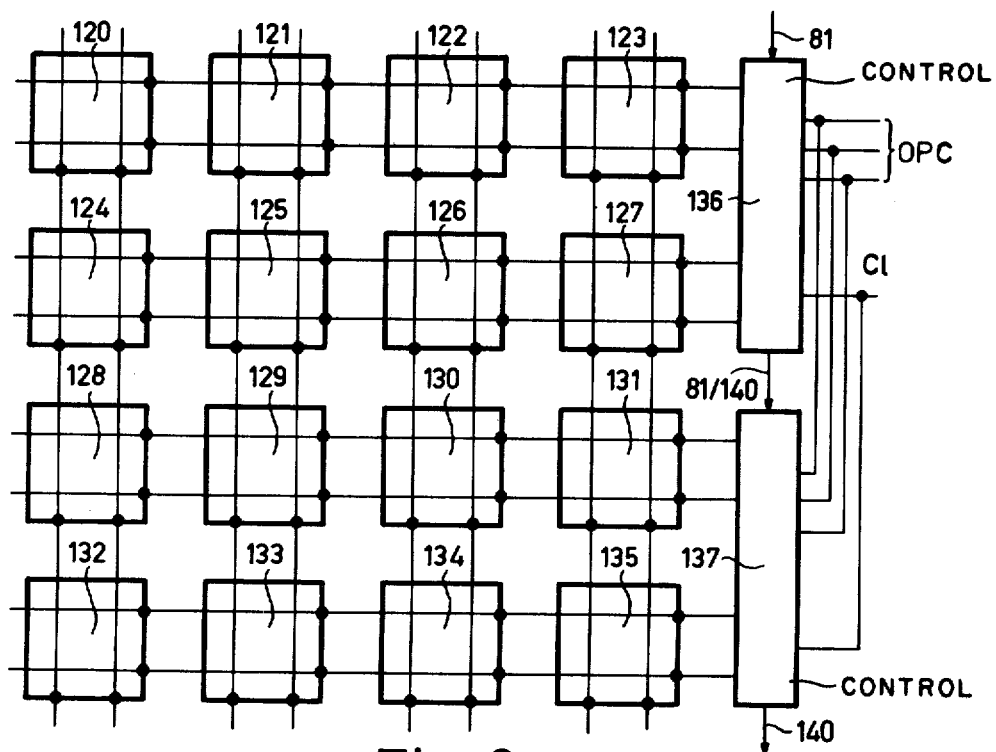
FIG. 6 shows a memory organization.

For the sake of simplicity, only the word lines and bit lines of the storage chips are shown in FIG. 6. Furthermore, only the word lines (diagrammatically), the operation code lines (OPC), the clock line (CL) and the transmission connections (81, 140) of the chips 136, 137 are shown.

What is claimed is:

1. A content-addressable memory having a matrix of bit cells for accommodating a plurality of multibit words on an integrated circuit, said integrated circuit comprising:

a first input for inputting a key word, a second input for inputting a mask word for the selective deactivation of a part of the input key word by masking, and an output for outputting a data word stored in a word location;

first means for comparing a non-masked part of a key word with a corresponding part of a data word stored in a word location;

second means for indicating, for each word location, correspondence detected by said first means and for activating said output for outputting data from a word location for which correspondence occurs, wherein said second means comprise a validity indicator for each word location, having a state "valid" and a state "invalid", for selectively indicating the validity of the word stored at this location, and for each word a correspondence indicator, having a state "correspondence" and a state "non correspondence", said validity indicator acting as a bit position of the associated word location, so that when the memory is addressed as regards valid word location content, said state "invalid" blocks the associated correspondence indicator for the effective supply of a signal "correspondence", each validity indicator comprising a switch input for selectively setting the indicator, by an externally applied switch signal, to the one or to the other state;

third means for clearing a part of the memory and for switching, under the control of a correspondence signal from the correspondence indicator of one or more word locations, the validity indicator of said one or more word locations to the state "invalid";

a multiple match resolver for forming, in the case of simultaneous appearance of at least two active "correspondence" signals, a sequence for accessing the associated word locations, wherein for the writing of a data word in a word location, the bit position corresponding to the data of the validity indicator remains exclusively unmasked by the mask word in order to control, in the position "invalid", the associated correspondence indicator so as to form a position "correspondence", after which the multiple match resolver controls a write enable signal for a single word location thus provided with a correspondence signal;

fourth means for switching, under the control of a sequence signal from said multiple match resolver, the correspondence indicator for a word location indicated by said sequence signal to the position "non-correspondence" in order to apply, when a read command signal is received, the data of a word location to said output only once.

2. A memory as claimed in claim 1, wherein said integrated circuit has a mask register for a mask word whose non-masking data location(s) bit-wise activate said first means and whose masking data location(s) bit-wise activate said output wherein said first input, said second input, said output, and an input for inputting a data word to be stored in a word location are connected together, via pins which are common for each bit position, to a data bus line.

3. A content addressable memory having a matrix of bit cells for accommodating a plurality of multibit words on an integrated circuit, said integrated circuit comprising:

a first input for inputting a key word, a second input for inputting a mask word for the selective deactivation of a part of the input key word by masking, an output for outputting a data word stored in a word location;

first means for comparing a non-masked part of a key word with a corresponding part of a data word stored in a word location:

second means for indicating, for each word location, correspondence detected by said first means and for activating said output for outputting data from a word location for which correspondence occurs, wherein said second means comprise a validity indicator for each word location, having a state "valid" and a state "invalid", for selectively indicating the validity of the word stored at this location, and for each word a correspondence indicator, having a state "correspondence" and a state "non-correspondence", said validity indicator acting as a bit position of the associated word location, so that when the memory is addressed as regards valid word location content, said state "invalid" blocks the associated correspondence indicator for the effective supply of a signal "correspondence", each validity indicator comprising a switch input for selectively setting the indicator, by an externally applied switch signal, to the one or to the other state;

third means for clearing a part of the memory and for switching, under the control of a correspondence signal from the correspondence indicator of one or more word locations, the validity indicator of said one or more word locations to the state "invalid";

a multiple match resolver for forming, in the case of simultaneous appearance of at least two active "correspondence" signals, sequence for accessing the associated word locations, wherein for the writing of a data word in a word location, exclusively the bit position corresponding to the data of the validity indicator remains unmasked by the mask word in order to control, in the position "invalid", the associated correspondence indicator so as to form a position "correspondence", after which the multiple match resolver controls the write enable signal for a single word location thus provided with a correspondence signal;

wherein furthermore said integrated circuit has a mask register for a mask word whose non-masking data location(s) bit-wise activate said first means and whose masking data location(s) bit wise activate said output, wherein said first input, said second input, said output, and an input for inputting a data word to be stored in a word location are connected together, via pins of said integrated circuit which are common for each bit position, to a data bus line.

4. A content-addressable memory as claimed in claims 2 or 3 further including a separate integrated circuit for the storage of n data words of m bits plus an associated mask word of corresponding length, said separate circuit comprising m connections to said bus, n connections each associated with a separate word serving for a correspondence signal for each word, power supply terminals as external connections, at least three connections for receiving mode selection signals in order to activate a decoder in the circuit and a connection for receiving a clock signal.

5. The content-addressable memory of claims 2 or 3 further including a separate integrated circuit for the storage of n data words of m bits plus an associated mask word of corresponding length, said separate circuit comprising m connections to said bus, n connections which are each associated with a separate word and each serving for a correspondence signal for each word, power supply terminals as external connections, at least three connections for receiving mode selection signals in order to activate a decoder in the circuit and a connecton for receiving a clock signal;

wherein said n connections are suitable for transporting a correspondence signal and a pointer signal to said circuit, said n connections comprising a unidirectional element, provided with a control terminal for alternatively determining a conducting direction therein, the control terminals of the n unidirectional elements all being interconnected in order to form together a single further external connection of said circuit.

6. The content-addressable memory of claims 2 or 3 further including fifth means for writing, under the control of an effective correspondence signal from a correspondence indicator, predetermined data for the bit positions of relevant word locations which are not masked by the prevailing mask word.

7. The content-addressable memory of claim 5 further including fifth means for writing, under the control of an effective correspondence signal from a correspondence indicator, predetermined data for the bit positions of the relevant word locations which are not masked by the prevailing mask word.

8. The content-addressable memory of claim 7 wherein said fifth means are furthermore suitable for writing, under the control of simultaneously appearing effective correspondence signals from the correspondence indicators of at least two word locations, predetermined data for the bit positions of relevant word locations which are not masked by the mask word then prevailing.

9. The content-addressable memory of claim 6 wherein said fifth means are furthermore suitable for writing, under the control of simultaneously appearing effective correspondence signals from the correspondence indicators of at least two word locations, predetermined data for the bit positions of relevant word locations which are not masked by the mask word then prevailing.

* * * * *